(12) United States Patent
Chieng et al.

(10) Patent No.: US 11,387,824 B1
(45) Date of Patent: Jul. 12, 2022

(54) VOLTAGE-CONTROLLED VARIED FREQUENCY PULSE WIDTH MODULATOR

(71) Applicant: NATIONAL YANG MING CHIAO TUNG UNIVERSITY, Hsinchu (TW)

(72) Inventors: Wei-Hua Chieng, Hsinchu (TW);
Edward Yi Chang, Hsinchu County (TW); Stone Cheng, Hsinchu (TW); Shyr-Long Jeng, Tainan (TW); Li-Chuan Tang, Taoyuan (TW); Chih-Chiang Wu, Hsinchu County (TW); Yueh-Tsung Hsieh, Hsinchu (TW); Ching-Yao Liu, Hsinchu (TW); Kuo-Bin Wang, Hsinchu (TW)

(73) Assignee: NATIONAL YANG MING CHIAO TUNG UNIVERSITY, Hsinchu (TW)

( * ) Notice: Subject to any disclaimer, the term of this patent is extended or adjusted under 35 U.S.C. 154(b) by 0 days.

(21) Appl. No.: 17/452,842

(22) Filed: Oct. 29, 2021

(30) Foreign Application Priority Data

Aug. 9, 2021 (TW) .................................. 110129312

(51) Int. Cl.
*H03K 7/08* (2006.01)
*H03K 17/687* (2006.01)
*H02J 50/12* (2016.01)

(52) U.S. Cl.
CPC ............. *H03K 7/08* (2013.01); *H03K 17/687* (2013.01); *H02J 50/12* (2016.02)

(58) Field of Classification Search
CPC ..................................................... H03K 7/08
(Continued)

(56) References Cited

U.S. PATENT DOCUMENTS

| 5,126,637 A | * | 6/1992 | Watts | ................ | H05B 41/2828 |
| | | | | | 315/DIG. 4 |
| 6,181,123 B1 | * | 1/2001 | Jou | ....................... | H02M 3/157 |
| | | | | | 363/41 |

(Continued)

FOREIGN PATENT DOCUMENTS

TW          I220333 B          8/2004

OTHER PUBLICATIONS

Bhagyalakshmi, et al. "Switched Capacitor Multilevel Inverter with Different Modulation Techniques." 2017 International Conference on Innovations in Information, Embedded and Communication Systems (ICIIECS) (Mar. 2017), pp. 1-6. doi: 10.1109/ICHIECS.8275925.

(Continued)

*Primary Examiner* — William Hernandez
(74) *Attorney, Agent, or Firm* — Rosenberg, Klein & Lee

(57) ABSTRACT

A voltage-controlled varied frequency pulse width modulator is provided, including a frequency-regulating voltage output device which receives a determining voltage, decides a resonant frequency according to the determining voltage and outputs an oscillation signal having the resonant frequency. A duty-ratio-regulating voltage output device receives the oscillation signal and a reference signal to determine a duty ratio through an inverting closed loop, so as to adjust the oscillation signal to have the duty ratio. By employing the proposed voltage-controlled modulator circuit with tunable frequency and varied pulse width of the present invention, a modulation signal having the determined resonant frequency and duty ratio is obtained. Moreover, the present invention can be further combined with gate drive waveform trend feedback designs to achieve superior power transmission efficiency of a wireless power (Continued)

transmission system to optimize the inventive effect of the present invention.

13 Claims, 7 Drawing Sheets

(58) Field of Classification Search
USPC .................................. 327/172, 175, 176, 177
See application file for complete search history.

(56) References Cited

U.S. PATENT DOCUMENTS

| | | | |
|---|---|---|---|
| 7,190,143 B2 | 3/2007 | Wei et al. | |
| 2005/0052249 A1* | 3/2005 | Gan | H02M 3/156 331/23 |
| 2010/0109767 A1* | 5/2010 | Midya | H03F 3/217 330/10 |
| 2011/0122656 A1* | 5/2011 | Chen | H02M 3/33523 363/16 |

OTHER PUBLICATIONS

Tavares, et al. "Implementation of a High Frequency PWM Signal in FPGA for GaN Power Devices Switching." 2017 Brazilian Power Electronics Conference (COBEP) (Nov. 2017), pp. 1-7. doi: 10.1109/COBEP.2017.8257309.

* cited by examiner

VOLTAGE-CONTROLLED VARIED FREQUENCY PULSE WIDTH MODULATOR

This application claims priority of Application No. 110129312 filed in Taiwan on 9 Aug. 2021 under 35 U.S.C. § 119; the entire contents of all of which are hereby incorporated by reference.

BACKGROUND OF THE INVENTION

Field of the Invention

The present invention relates to modulation techniques for voltage-controlled signals. More particularly, it is related to a voltage-controlled modulator circuit with varied pulse width and tunable frequency output in a radio frequency band by adjusting and controlling voltages input to the modulator circuit.

Description of the Prior Art

In general, pulse-width modulation (PWM) is a certain kind of technology that converts an analog signal into a pulse signal. Normally, the converted pulse signal has a fixed duty cycle, and the duty cycle varies according to the magnitude of the analog signal. As known, a digital PWM circuit is able to perform sampling within a predetermined range, and outputs either a digital logic state "1" or a digital logic state "0" at any time. Therefore, by connecting or disconnecting the voltages or currents to repeat the pulse sequence, it is converted to the analog load. However, regarding an analog PWM circuit, since the voltage level of an analog signal change continuously all the time, and is not limited to time or magnitude, it is practicable to directly take the output voltage and current in analog circuits to control end devices, for example, volume switch control in household appliances, brightness control using halogen bulbs, and so on. However, there are still issues existing to be solved among analog circuits, for example, the control signal usually drifts over time easily, being difficult to control, having tremendous power consuming problems, being susceptible to noise and environmental interferences, and etc.

Overall, the PWM technology is a digital coding methodology applied to a voltage level of an analog signal. By using a high-resolution counter (modulation frequency) to modulate the duty ratio of a square wave, the voltage level of an analog signal is then coded. The PWM technology is mostly advantageous of modulating all the signals from the processor to its end device to be controlled in digital forms without involving any conversion between digital and analog formats. In addition, it helps to enhance the noise interference tolerance. In general, the noise interference is only possible to have a literal impact on digital signals unless it is strong enough to change the logic value. As a result, the PWM technology has been well known and can be widely applied in communication and data transfer related fields nowadays.

However, it still draws our attention that, in recent years, most of the high-frequency electronic oscillation devices are involved with digital logic circuits having output square waveforms of a 50% duty ratio. On the contrary, the low-frequency electronic oscillation devices that use PWM technology are mainly involved with analog control circuits. Nevertheless, it is investigated and believed that none of the existing technologies and relative disclosed applications have successfully implemented the pulse width modulation technology in the radio frequency (RF) band, whereby it has greatly restricted the application of the RF band oscillators and made the RF band oscillators in lack of utility in any related industries or academic research.

As a result, on account of the above, to overcome the above-mentioned problems, it should be obvious that there is indeed an urgent need for the professionals in the field for proposing a new modulator circuit to be developed that can effectively solve the above-mentioned problems occurring in the prior design. And by using such a novel and inventive modulator circuit, an output modulation signal with both varied duty ratio and tunable frequency output in the RF band is successfully and effectively obtained. Moreover, a further optimization result of a wireless power transfer system employing the present invention can be implemented. Hereinafter, the detailed specific implementations will be fully described in the following paragraphs.

SUMMARY OF THE INVENTION

In order to overcome the above-mentioned disadvantages, one major objective in accordance with the present invention is to provide a varied frequency pulse width modulator (VFPWM) circuit. Due to the modulator circuit disclosed in the present invention, an oscillation signal output in a radio frequency (RF) band can be generated through a simple voltage control mechanism. In addition, for complying with a variety of application requirements, it is also practicable to input various voltages to the modulator circuit, so as to vary the resonant frequency and duty ratio output by the circuit and to achieve an inventive effect of adjustable both pulse width and frequency of the present invention.

In another aspect, another major objective in accordance with the present invention is to provide an extremely innovative voltage-controlled varied frequency pulse width modulator (VFPWM) circuit, which performs to offer a control strategy to the resonant frequency and duty ratio of the oscillation signal output by the modulator circuit through varying the input voltage of the circuit. In general, the input voltage of the modulator circuit can be controlled as being no greater than 5V and having an approximate resolution of around 10 μV.

And yet in another aspect, another major objective in accordance with the present invention is to provide a voltage-controlled VFPWM circuit, which is applicable to a wireless power transfer (WPT) device and system application thereof. The voltage-controlled VFPWM circuit proposed in the present invention can be not only miniaturized and assembled into a semiconductor integrated circuit, but also applied to a typical WPT system through the technical solution of generating adjustable resonant frequency and duty cycle disclosed in the present invention. And meanwhile, since parameters of a gate driving circuit and class E amplifier circuit in the WPT system can be further designed in view of the trend feedback of its gate drive waveforms, the present invention also achieves to obtain an even further optimized invention benefit, comprising realizing a frequency of 6.78 MHz application of the depletion-mode (D-mode) GaN high electron mobility transistor (HEMT) in wireless power transmission systems.

As a result, for achieving the above-mentioned objectives, the technical solutions of the present invention are aimed to provide a voltage-controlled varied frequency pulse width modulator, which includes a frequency-regulating voltage output device, for receiving a determining voltage, deciding a resonant frequency according to the determining voltage and outputting an oscillation signal having the resonant frequency; and a duty-ratio-regulating voltage output device which includes a first input terminal and a second input terminal for respectively receiving a reference signal and the oscillation signal from the frequency-regulating voltage output device. As a result, the duty-ratio-regulating voltage output device determines a duty ratio through an inverting closed loop, adjusts the oscillation signal to have the duty ratio, and generates a modulation signal having the resonant frequency determined by the frequency-regulating voltage output device and the duty ratio at an output terminal of the duty-ratio-regulating voltage output device. According to the present invention, the output modulation signal is thus having the specific determined resonant frequency and the duty ratio.

In one embodiment of the present invention, such frequency-regulating voltage output device, for example, can be a voltage-controlled oscillator, and the voltage-controlled oscillator outputs the oscillation signal based on:

$$f_0 = G_{Z0}(V_F - g(V_R)),$$

wherein $f_0$ is the resonant frequency of the oscillation signal, $G_{Z0}$ is a gain constant of the voltage-controlled oscillator, $g(V_R)$ is a nonlinear feedback function of the voltage-controlled oscillator, and $V_F$ is the determining voltage. By such design manners, the present invention succeeds in designing a frequency band of the resonant frequency in a radio frequency (RF) band. And, the RF band has a frequency in a range of hundreds of kHz to 30 MHz.

On the other hand, regarding the duty-ratio-regulating voltage output device, the above-mentioned inverting closed loop of the duty-ratio-regulating voltage output device may include an operational amplifier, a first resistor, a second resistor, a third resistor, a fourth resistor, a first capacitor, and a second capacitor.

The operational amplifier is electrically connected between a high voltage level and a ground level and includes a first input end, a second input end, and an output end. The output end is electrically connected to the output terminal of the duty-ratio-regulating voltage output device. The first resistor is electrically connected between the first input terminal of the duty-ratio-regulating voltage output device and the first input end of the operational amplifier, and a first capacitor is further connected between the first input end of the operational amplifier and the ground level. The second resistor is electrically connected between the second input terminal of the duty-ratio-regulating voltage output device and the second input end of the operational amplifier, and a second capacitor is further connected between the second input end of the operational amplifier and the ground level. The third resistor is electrically connected between the first input end and the output end of the operational amplifier. And the fourth resistor is electrically connected between the second input end of the operational amplifier and the ground level. According to the embodiment of the present invention, the first resistor, the second resistor, the third resistor, and the fourth resistor are matched to have the same resistance.

In one embodiment of the present invention, the operational amplifier determines the duty ratio based on:

$$\delta = \frac{1}{2} + \frac{T_{cm}}{(1+\alpha)T} \ln\left(\frac{V_Z - 2V_{ref}}{V_Z - V_{ref}}\right),$$

wherein $\delta$ is the determined duty ratio, $V_Z$ is the oscillation signal output by the frequency-regulating voltage output device, $V_{ref}$ is the reference signal, $\alpha$ is a feedback gain of the operational amplifier, $T_{cm}$ is a time constant for charging the first capacitor and the second capacitor in common mode, and T is a switching period for wireless power transmission.

According to a preferred embodiment of the present invention, a voltage level of the reference signal $V_{ref}$ can be controlled in a range between 0 and 2.5V. The determined duty ratio $\delta$ is in a range between 0 and 50%. Preferably, the duty cycle $\delta$ can be controlled between 10% and 50%.

And furthermore, according to the voltage-controlled varied frequency pulse width modulator of the present invention, its generated modulation signal having the determined resonant frequency and duty ratio can be directly or indirectly connected to and used by an electronic device. The electronic device may comprise, and yet not limited to a single integrated circuit chip, an assembly electronic circuit, an electromagnetic wave antenna, a signal amplifying circuit, a digital signal processing circuit, a digital logic electronic circuit, a wireless power transfer device, and an optical driving circuit. As such, the foregoing determining voltage can be integrated or provided in the electronic device.

And yet, according to other embodiment of the present invention, the determining voltage may also be provided through a microcontroller unit (MCU) combined with a user electronic command so as to provide control over the determining voltage. According to the present invention, the user electronic command can be alternatively selected from a group of an unmanned aerial vehicle (UAV) computer, an unmanned ground vehicle (UGV) computer, a personal computer, a tablet computer, a smart mobile device, and so on. In general, those skilled in the art and having general knowledge are able to make appropriate modifications or variations with respect to the technical solutions disclosed in the present invention without departing from the spirits of the present invention. However, the modifications or variations should still fall into the scope of the present invention. The present invention is certainly not limited to the circuit types, its internal circuit connections and/or electrical characteristics disclosed in these embodiments.

Moreover, in one embodiment of the present invention, when the foregoing electronic device is a wireless power transfer (WPT) device, the WPT device may comprise a gate driving circuit, a switching component, and an amplifier circuit. For an optimal design effect, the switching component thereof can be a depletion-mode GaN high electron mobility transistor (GaN HEMT), and the amplifier circuit is a class E amplifier circuit. Specifically, the class E amplifier circuit, for example, may include a capacitor, a first inductor, a second inductor, and a load resistor. A node is configured between the switching component, the first inductor, and the capacitor. Another end of the first inductor, which is opposite to the node, is connected with an input voltage signal, and another end of the capacitor, which is opposite to the node, is connected with the second inductor. The second inductor is further connected to the load resistor, such that a minimum power input is accordingly generated at the output terminal which is located between the second inductor and the load resistor. Through such the configuration, the present invention achieves to generate an optimal result of a minimum power input control and comply with the wireless power transmission application in response to the resonant frequency of 6.78 MHz, by employing trend feedback waveforms of the gate driving circuit.

Therefore, to sum above, it is apparent that the present invention mainly discloses a voltage-controlled modulator circuit, which associates a VCO (voltage-controlled oscillator) diagram with the high-frequency PWM (pulse width modulation) technology of an operational amplifier to form a varied frequency pulse width modulator. According to the voltage-controlled modulator circuit disclosed in the present invention, tunable resonant frequency and varied duty ratio can be achieved by employing the control strategy of adjusting the input voltage signal. Furthermore, the Applicants propose that, by controlling a minimum power input of the input voltage signal as well as a relatively simple look-up method using empirical data, the present invention is successful in meeting operating requirements in a 6.78 MHz resonant wireless power transmission application. And thus, it is believed that an optimal power transmission efficiency of the wireless power transmission system is accomplished. In addition, the Applicants would like to emphasize and assert that the foregoing embodiments of the present invention are described with a class E amplifier circuit, merely for an illustrative example as to enable those skilled in the art to fully understand the technical features of the present invention and are not intended to limit the application of the present invention. In other words, the control strategy of the minimum power input by employing the technical contents disclosed in the present invention can also be further applied to various types of amplifier circuits and is not limited to a class E amplifier circuit. And also, the switching component used in the amplifier circuit is certainly not limited to a typical one as mentioned in the embodiment of the invention.

These and other objectives of the present invention will become obvious to those of ordinary skill in the art after reading the following detailed description of preferred embodiments.

It is to be understood that both the foregoing general description and the following detailed description are exemplary and are intended to provide further explanation of the invention as claimed.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
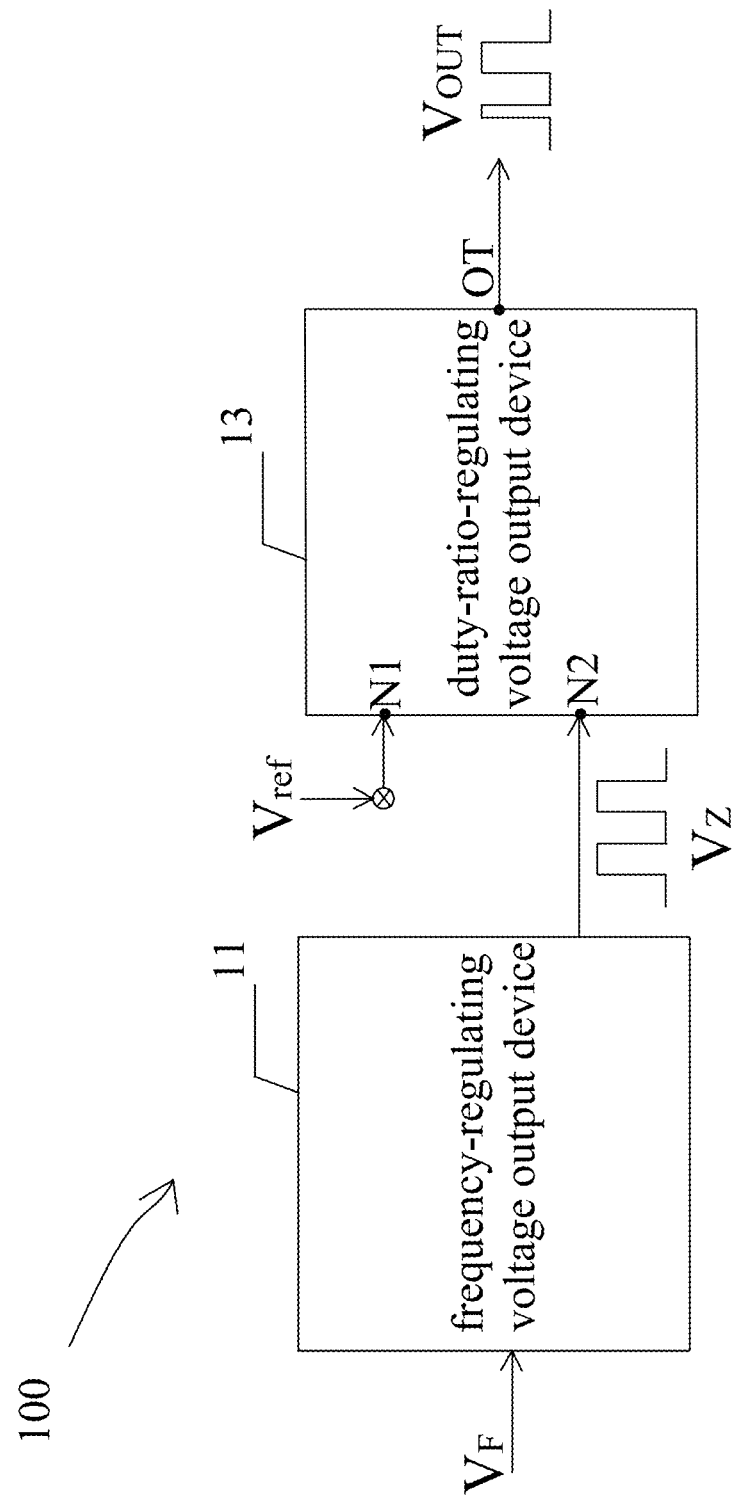
FIG. 1 shows a schematic diagram of a voltage-controlled varied frequency pulse width modulator (VFPWM) in accordance with one embodiment of the present invention.

The above summary and the following embodiments are used to demonstrate and explain the spirit and principle of the present invention and to provide a further explanation of the patent claim scope of the present invention. Regarding the features, implementation and effects of the present invention, please find embodiments that will be described in detail as follows in conjunction with the drawings in the following paragraphs.

Reference will now be made in detail to the preferred embodiments of the present invention, examples of which are illustrated in the accompanying drawings. Wherever possible, the same reference numbers are used in the drawings and the description to refer to the same or like parts.

In general, the present invention is aimed to solve the foregoing above-mentioned problems existing in the prior arts and to provide an oscillator circuit with varied duty ratio and tunable RF frequency band. The technical solution to modulating the resonant frequency and duty ratio of the oscillator circuit is to control and adjust its input voltage. Therefore, for achieving the objectives of the present invention, the Applicants of the present invention provide a voltage-controlled modulator circuit with tunable frequency and varied pulse width. The embodiments described below are illustrated to demonstrate the technical contents and characteristics of the present invention and to enable the persons skilled in the art to understand, make, and use the present invention. However, it shall be noticed that it is not intended to limit the scope of the present invention. Therefore, any equivalent modification or variation according to the spirit of the present invention is to be also included within the scope of the present invention.

At first, please refer to FIG. 1, which shows a schematic diagram of a voltage-controlled varied frequency pulse width modulator (VFPWM) in accordance with one embodiment of the present invention, in which the voltage-controlled VFPWM 100 includes a frequency-regulating voltage output device 11 and a duty-ratio-regulating voltage output device 13. The frequency-regulating voltage output device 11 receives a determining voltage $V_F$ and decides a resonant frequency $f_0$ according to the determining voltage $V_F$. Therefore, the frequency-regulating voltage output device 11 is able to output an oscillation signal $V_Z$ having the resonant frequency $f_0$.

The duty-ratio-regulating voltage output device 13 includes a first input terminal N1 and a second input terminal N2. The first input terminal N1 is configured to receive a reference signal $V_{ref}$ and the second input terminal N2 is configured to receive the oscillation signal $V_Z$ from the frequency-regulating voltage output device 11. As such, after receiving the reference signal $V_{ref}$ and the oscillation signal $V_Z$, the duty-ratio-regulating voltage output device 13 determines a duty ratio δ through an inverting closed loop and adjusts the oscillation signal $V_Z$ to have the duty ratio δ. Therefore, the duty-ratio-regulating voltage output device 13 is able to generate a modulation signal $V_{OUT}$ having the determined resonant frequency $f_0$ determined by the frequency-regulating voltage output device 11 and the duty ratio δ at an output terminal OT of the duty-ratio-regulating voltage output device 13. According to the embodiment of the present invention, the generated modulation signal $V_{OUT}$ is characterized by having a tunable frequency and varied pulse width (duty ratio δ).

In detail, according to the embodiment of the present invention, the frequency-regulating voltage output device 11, for instance, can be a voltage-controlled oscillator (VCO). And the voltage-controlled oscillator (VCO) basically uses a capacitor and an inductor of a varactor diode and electrically couples the capacitor and the inductor to form an LC resonant circuit. When a reverse bias voltage of the varactor diode is increased, the depletion region in the varactor diode can be increased; while when the distance between two conductor surfaces gets further, it reduces the capacitance, and under such a condition, the resonant frequency of the LC resonant circuit will be increased. On the contrary, when the reverse bias voltage is lowered, the capacitance in the varactor diode is increased, and the resonant frequency of the LC resonant circuit will be reduced. As for no voltage being applied, then the LC resonant circuit outputs a minimum value of the resonant frequency. Therefore, by such design manners, the frequency-regulating voltage output device 11 (the voltage-controlled oscillator) disclosed in the present invention is able to generate a minimum resonant frequency of the LC resonant circuit according to a predetermined capacitance and inductance value of the varactor diode, and the frequency-regulating voltage output device 11 (the voltage-controlled oscillator) gradually increases its output resonant frequency in response to an increasing reverse bias being applied.

In a preferred embodiment of the present invention, the VCO (the frequency-regulating voltage output device 11) outputs the oscillation signal $V_Z$ based on the following equation (1).

$$f_0 = G_{Z0}(V_F - g(V_R)) \quad (1),$$

wherein $f_0$ is the resonant frequency determined by the VCO, which is also the determined resonant frequency of the oscillation signal $V_Z$, $G_{Z0}$ is a gain constant of the voltage-controlled oscillator, $g(V_R)$ is a nonlinear feedback function of the voltage-controlled oscillator, and $V_F$ is the determining voltage mentioned earlier. As described previously, when the determining voltage $V_F$ is increased, the determined resonant frequency $f_0$ output by the frequency-regulating voltage output device 11 is increased. As a result, in a further aspect according to the technical contents disclosed in the present invention, people who are skilled and having ordinary knowledge backgrounds in the art are able to retrieve the nonlinear feedback functions $g(V_R)$ according to a variety of IC specifications and simply by comparing with a look-up table, it is achievable to generate a required resonant frequency that is in rapid response to a wireless power transmission application when necessary.

In the preferred embodiment of the present invention, a frequency band of the generated resonant frequency $f_0$ is a radio frequency (RF) band. And, the radio frequency (RF) band can be determined and controlled in a range of hundreds of kHz to 30 MHz. As a result, it is evident that in view of the design manners of the proposed VCO of the present invention, the resonant frequency $f_0$ can be determined according to the applied determining voltage $V_F$, such that the frequency-regulating voltage output device 11 of the present invention outputs the oscillation signal $V_Z$ having the resonant frequency $f_0$.

Figure 2:
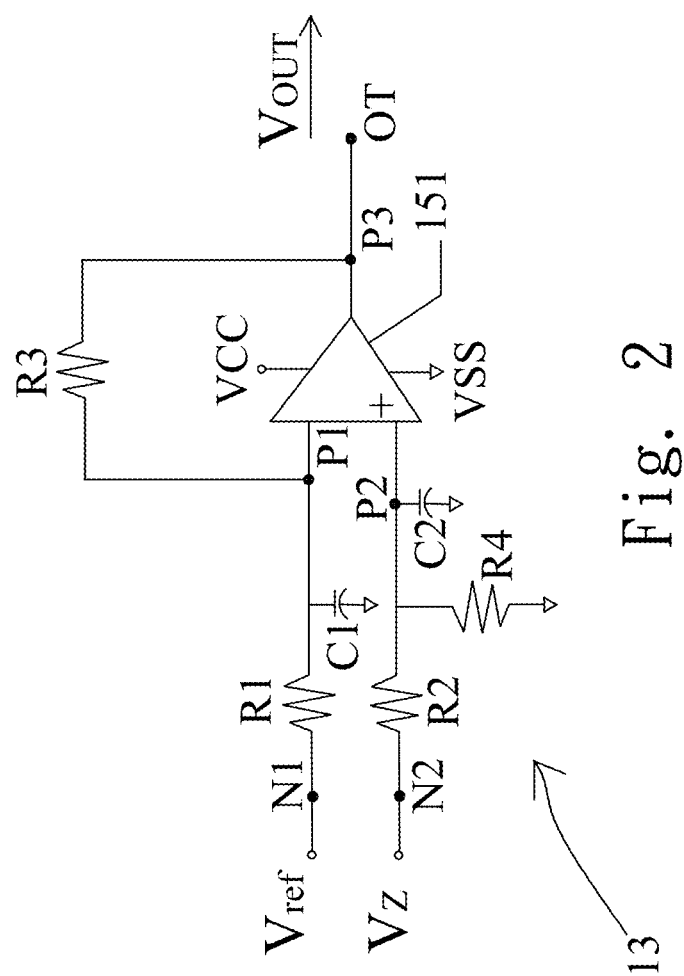
FIG. 2 shows a detailed schematic diagram of the duty-ratio-regulating voltage output device in accordance with the embodiment of the present invention.

In another aspect, please refer to FIG. 2 for a detailed schematic diagram of the duty-ratio-regulating voltage output device in accordance with the embodiment of the present invention. As proposed in the earlier descriptions, after receiving the reference signal $V_{ref}$ and the oscillation signal $V_Z$, the duty-ratio-regulating voltage output device 13 determines a duty ratio δ through an inverting closed loop and adjusts the oscillation signal $V_Z$ to have the duty ratio δ.

According to the embodiment as shown in FIG. 2, the duty-ratio-regulating voltage output device 13 includes an operational amplifier (op-amp) 151, a first resistor R1, a second resistor R2, a third resistor R3, a fourth resistor R4, a first capacitor C1 and a second capacitor C2. Please refer to FIG. 2, in which the operational amplifier 151 is electrically connected between a high voltage level VCC and a ground level VSS and the operational amplifier 151 includes a first input end P1, a second input end P2, and an output end P3, wherein the output end P3 is electrically connected to the output terminal OT of the duty-ratio-regulating voltage output device 13 as illustrated in FIG. 1.

The first resistor R1 is electrically connected between the first input terminal N1 of the duty-ratio-regulating voltage output device 13 and the first input end P1 of the operational amplifier 151 to receive the reference signal $V_{ref}$. The first capacitor C1 is further connected between the first input end P1 of the operational amplifier 151 and the ground level VSS.

The second resistor R2 is electrically connected between the second input terminal N2 of the duty-ratio-regulating voltage output device 13 and the second input end P2 of the operational amplifier 151 to receive the oscillation signal $V_Z$. The second capacitor C2 is further connected between the second input end P2 of the operational amplifier 151 and the ground level VSS.

The third resistor R3 is electrically connected between the first input end P1 and the output end P3 of the operational amplifier 151. The fourth resistor R4 is electrically connected between the second input end P2 of the operational amplifier 151 and the ground level VSS. In the embodiment of the present invention, the above-mentioned first resistor R1, the second resistor R2, the third resistor R3, and the fourth resistor R4 are matched to have the same resistance. In general, the present invention adopts the operational amplifier 151 along with the first resistor R1, the second resistor R2, the third resistor R3, the fourth resistor R4 and matching with the first capacitor C1 and the second capacitor C2 to provide a high-frequency pulse width modulation. And therefore, by adjusting the inverting closed loop of the operational amplifier as shown in FIG. 2, the duty-ratio-regulating voltage output device 13 of the present invention is realized.

Preferably, according to the embodiment of the present invention, a voltage level of the applied reference signal $V_{ref}$ is in a range between 0 and 2.5V, such that the operational amplifier 151 is able to determine the duty ratio δ based on the following equation (2).

$$\delta = \frac{1}{2} + \frac{T_{cm}}{(1+\alpha)T} \ln\left(\frac{V_Z - 2V_{ref}}{V_Z - V_{ref}}\right), \quad (2)$$

wherein δ is the determined duty ratio, $V_Z$ is the oscillation signal output by the frequency-regulating voltage output device 11, $V_{ref}$ is the reference signal, α is a feedback gain of the operational amplifier 151, $T_{cm}$ is a time constant for charging the first capacitor C1 and the second capacitor C2 in common mode, and T is a switching period for wireless power transmission.

Therefore, after receiving the reference signal $V_{ref}$ and the oscillation signal $V_Z$, the duty-ratio-regulating voltage output device 13 of the present invention is able to employ the inverting closed loop as illustrated in FIG. 2 and the equation (2) disclosed above to determine a corresponding duty ratio δ, so as to adjust the oscillation signal $V_Z$ to have the duty ratio δ. Under such a condition, the duty-ratio-regulating voltage output device 13 is able to generate a modulation signal $V_{OUT}$ at its output terminal OT. According to the embodiment of the present invention, the generated modulation signal $V_{OUT}$ in the present invention is designed to have a specific resonant frequency $f_0$ and a specific duty ratio δ. Preferably, the resonant frequency $f_0$ is applicable to an RF frequency band, for example, in an RF frequency band between hundreds of kHz and 30 MHz. And, the duty ratio δ is in a range between 0 and 50%.

Figure 3:
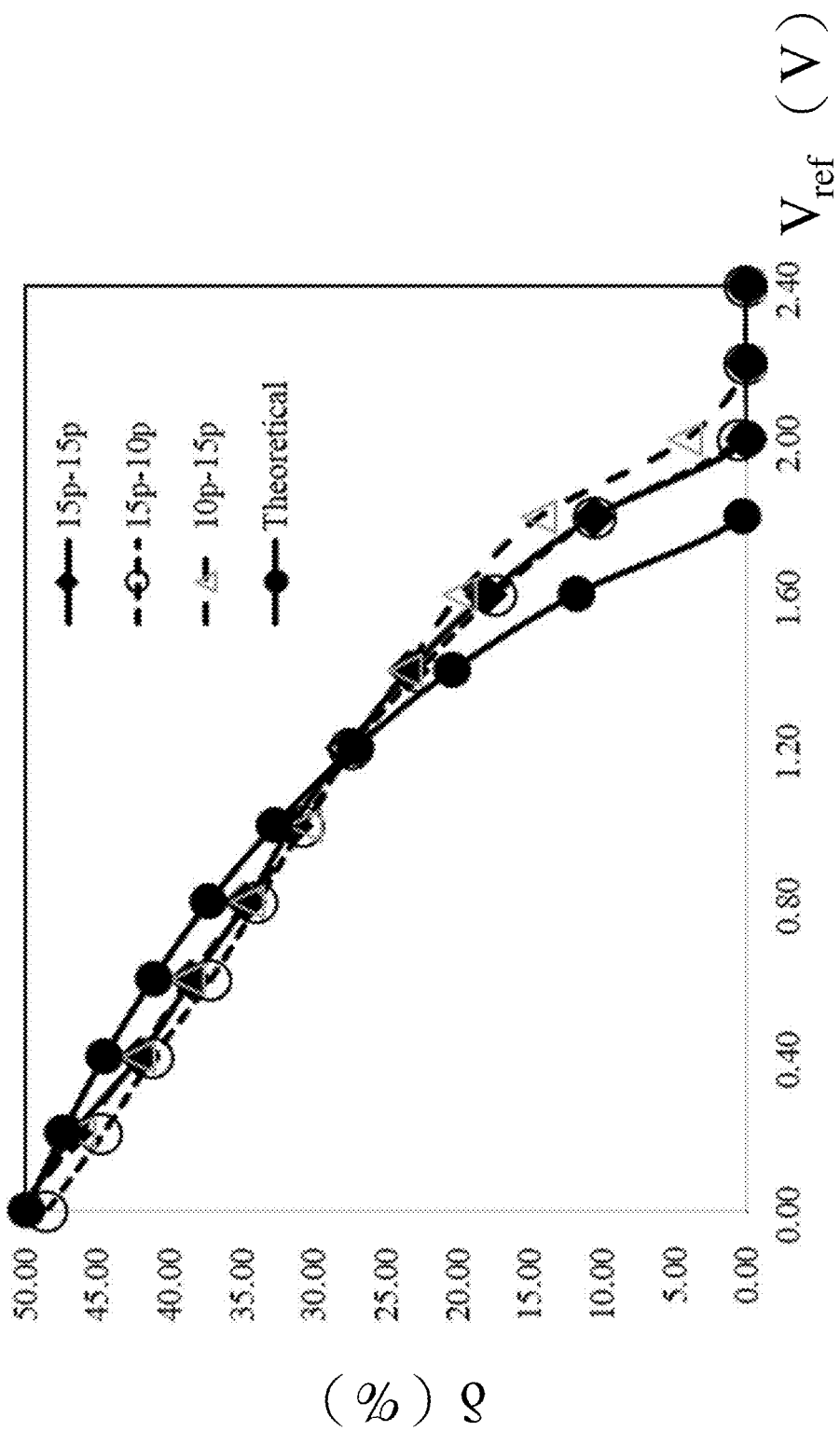
FIG. 3 shows simulation data in accordance with embodiments of the present invention to verify how the voltage-controlled signal influences the duty ratio in a condition when the resistance is fixed while matching the capacitance.

In the following, the Applicants further provide relevant simulation data to verify how the voltage-controlled signal influences the generated duty ratio. The simulation data are carried out either in a condition when the resistance is fixed while matching the capacitance, or in a condition when the capacitance is fixed while matching the resistance. Please refer to FIG. 3 and FIG. 4 successively. Firstly, in FIG. 3, the resistance of the first resistor R1, the second resistor R2, the third resistor R3, and the fourth resistor R4 is fixed. And the Applicants perform individual simulation experiments respectively under the condition of the capacitance of the first and second capacitor C1=15 pF, C2=15 pF; the capacitance of the first and second capacitor C1=15 pF, C2=10 pF; and the capacitance of the first and second capacitor C1=10 pF, C2=15 pF. As can be seen in the FIG. 3 result diagram, it is apparent that, when the applied reference signal $V_{ref}$ increases, the generated duty ratio δ decreases.

Figure 4:
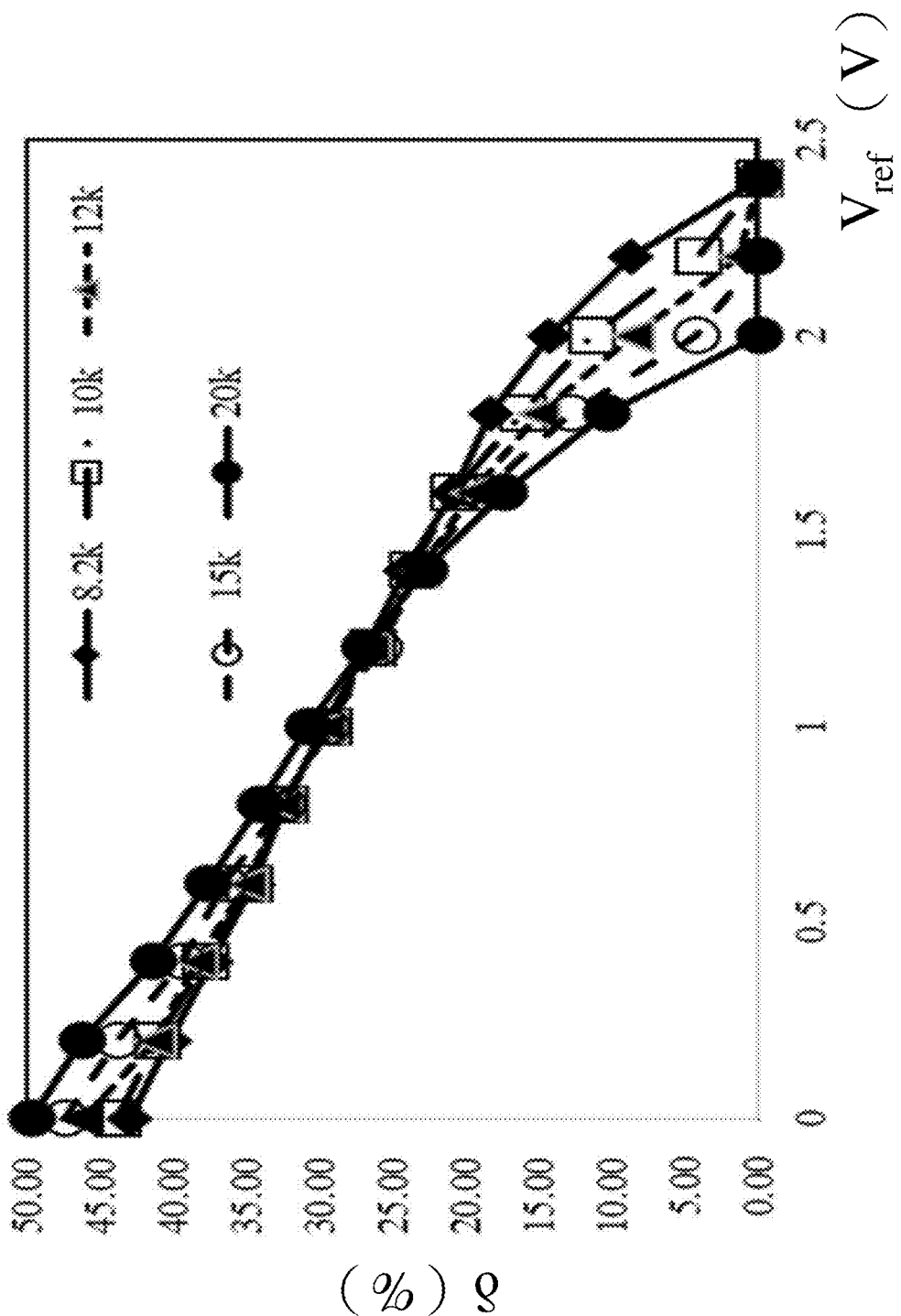
FIG. 4 shows simulation data in accordance with embodiments of the present invention to verify how the voltage-controlled signal influences the duty ratio in a condition when the capacitance is fixed while matching the resistance.

As for the simulation result in FIG. 4, the experiments are taken under the situation that the capacitance of the first capacitor C1 and the second capacitor C2 is fixed. And the Applicants perform individual simulation experiments respectively under the condition of the resistance of the first, the second, the third, and the fourth resistor R1=R2=R3=R4=8.2 kΩ; the resistance of the first, the second, the third, and the fourth resistor R1=R2=R3=R4=10 kΩ; the resistance of the first, the second, the third and the fourth resistor R1=R2=R3=R4=12 kΩ; the resistance of the first, the second, the third and the fourth resistor R1=R2=R3=R4=15 kΩ; and the resistance of the first, the second, the third and the fourth resistor R1=R2=R3=R4=20 kΩ. Similarly, as can be seen in the FIG. 4 result diagram, it is apparent that, when the applied reference signal $V_{ref}$ increases, the generated duty ratio δ decreases. In one embodiment of the present invention, the duty ratio δ is controlled in a range between 0 and 50%, preferably between 10% and 50%.

Figure 5:
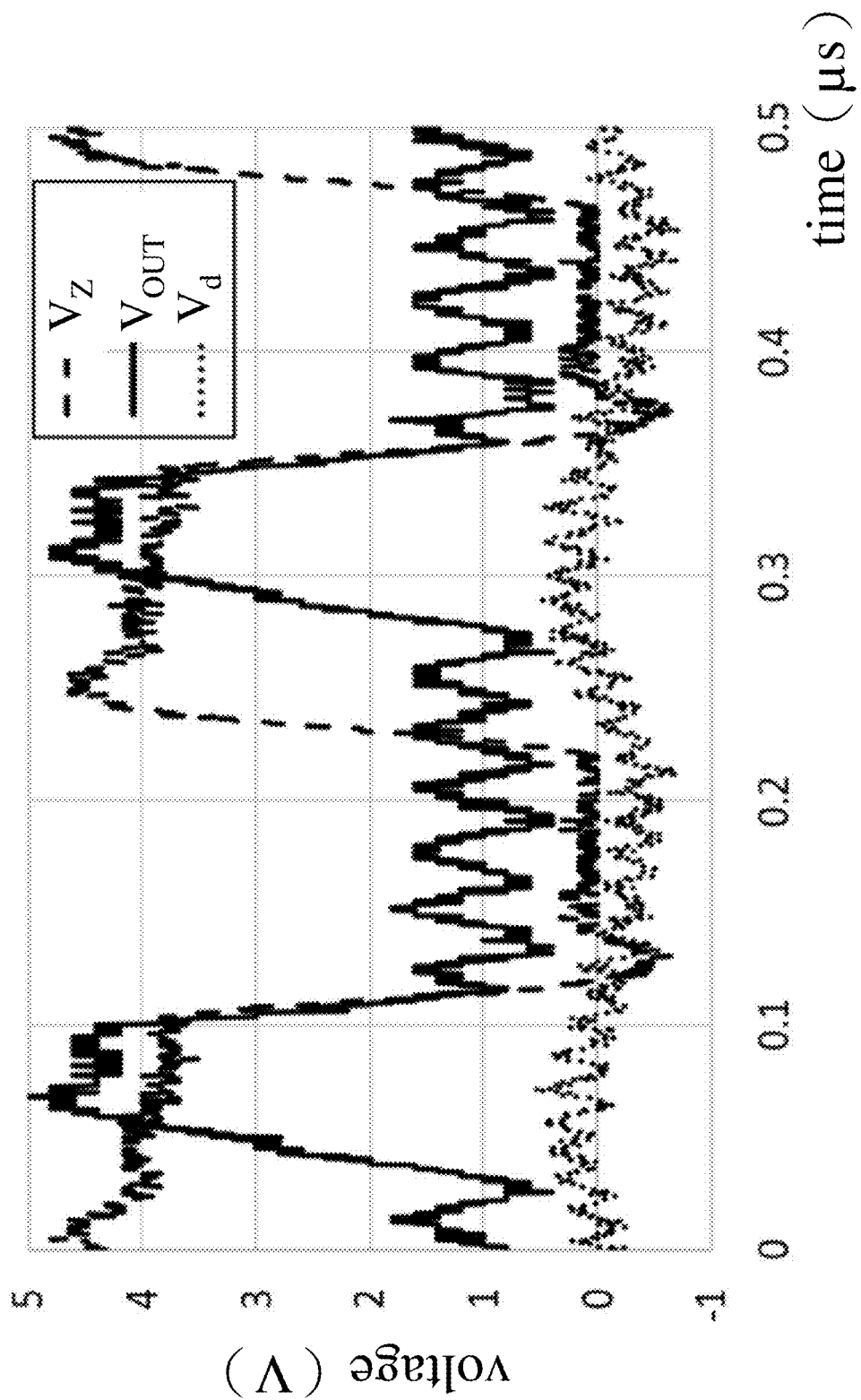
FIG. 5 shows a plurality of waveforms obtained in the voltage-controlled varied frequency pulse width modulator (VFPWM) in accordance with the embodiment of the present invention.

As a result, to sum above, it is apparent that the present invention mainly adopts the above-mentioned two techniques (including the frequency-regulating voltage output device and the duty-ratio-regulating voltage output device) as well as a plurality of matching resistors and capacitors to implement a voltage-controlled varied frequency pulse width modulator (VFPWM), which is able to output a modulation signal with tunable frequency and varied pulse width based on its input voltage. Please refer to FIG. 5 for the waveforms obtained in the voltage-controlled varied frequency pulse width modulator (VFPWM) in accordance with the embodiment of the present invention. As shown in FIG. 5, $V_Z$ is the oscillation signal output by the frequency-regulating voltage output device 11. $V_d$ is a voltage difference between the first input end P1 and the second input end P2 of the operational amplifier 151. $V_{OUT}$ is the modulation signal generated by the voltage-controlled VFPWM of the present invention. From the waveforms illustrated in FIG. 5, it is obvious that the modulation signal $V_{OUT}$ generated by the voltage-controlled VFPWM of the present invention has a tunable frequency and varied pulse width (duty ratio). As a result, it is believed that according to the main technical contents and technical characteristics of the present invention, those skilled in the art are enabled to select and choose adequate voltage input to control and obtain a desired resonant frequency and duty ratio according to actual circuit implementation requirements. However, it should be noted that these embodiments are not intended to limit the scope of the present invention. And therefore, it is believed that any equivalent modifications or variations thereof based on the spirits of the present invention should also be included in the scope of the present invention. For references, please find Table 1 in below for the electrical parameters of the voltage-controlled varied frequency pulse width modulator (VFPWM) according to the embodiment of the present invention.

TABLE 1

| parameter | unit | value |
|---|---|---|
| T | ns | 250 |
| R | Ω | 10k |
| $C_{cm}$ | pF | 15 |
| $T_{cm}$ | ns | 100 |
| $A_{dm}$ | | 100 |
| $\Theta_{dm}$ @4 MHz | degree | 60 |
| α | | 3 |

In Table 1, T stands for a switching period for wireless power transmission. R stands for a basic resistance of a differential amplifier. $C_{cm}$ stands for a common capacitor of the differential amplifier. $T_{cm}$ stands for a time constant for charging the common capacitor. $A_{dm}$ stands for a differential mode gain of the operational amplifier. $\theta_{dm}$ stands for a differential mode phase delay of the operational amplifier. α is a feedback gain of the operational amplifier.

Figure 6:
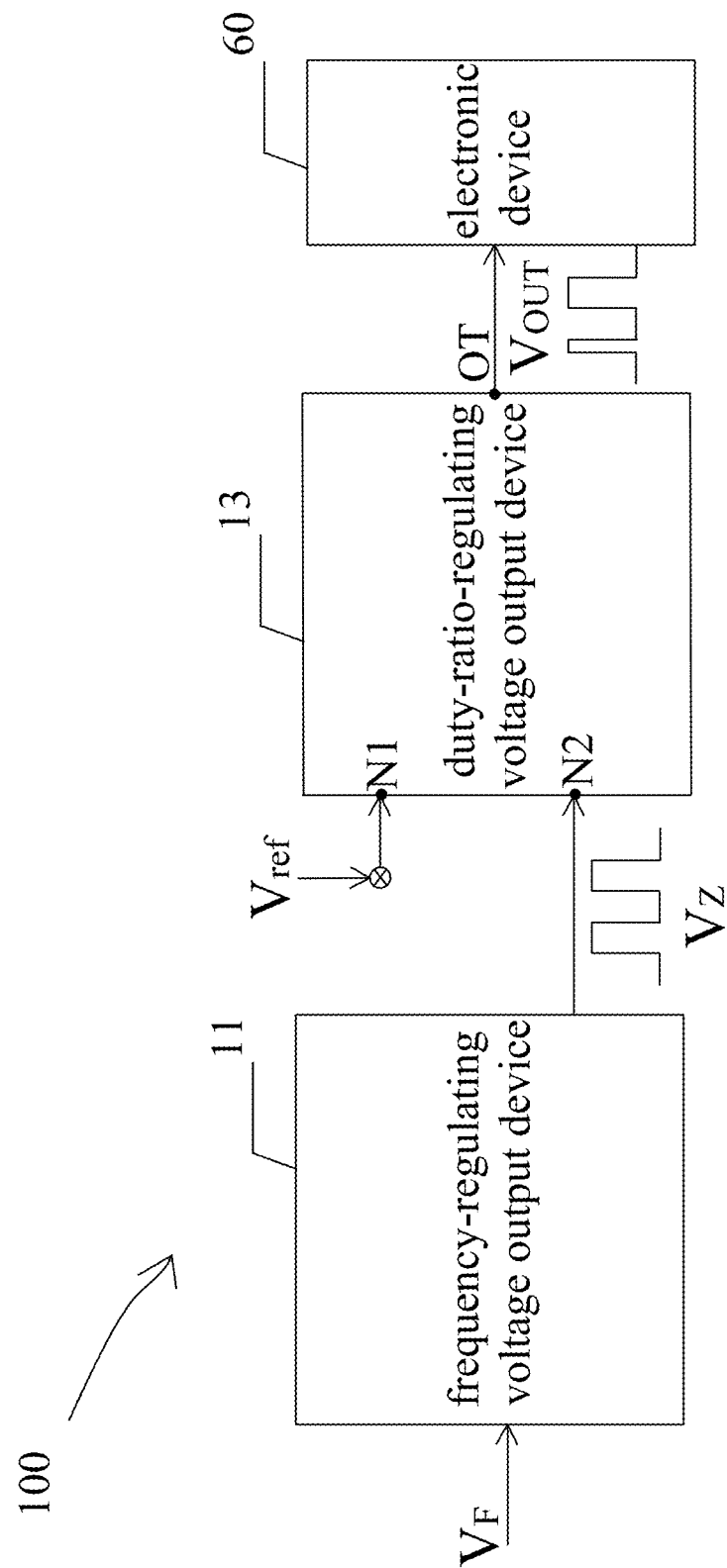
FIG. 6 shows a schematic diagram when an electronic device is further electrically connected to the voltage-controlled varied frequency pulse width modulator (VFPWM) to receive the modulation signal in accordance with the embodiment of the present invention.

Moreover, in order to further meet the practical application needs, according to the voltage-controlled varied frequency pulse width modulator disclosed in the present invention, the generated modulation signal having a tunable frequency and varied pulse width can be further directly or indirectly connected to and used by an electronic device. As shown in FIG. 6, the electronic device 60 is electrically connected to the voltage-controlled varied frequency pulse width modulator 100 and receives the modulation signal $V_{OUT}$. Afterward, the electronic device 60 is able to use the modulation signal $V_{OUT}$ directly. Alternatively, the electronic device 60 is also able to receive the modulation signal $V_{OUT}$ first and take the signal into an application after further processing with the signal. According to a variety of application fields, the electronic device 60, for example, can be a single integrated circuit chip (IC), an assembly electronic circuit, an electromagnetic wave antenna, a signal amplifying circuit, a digital signal processing circuit, a digital logic electronic circuit, a wireless power transfer (WPT) device, or an optical driving circuit. In one embodiment, the optical driving circuit, for instance, can be a pulsed laser driver device, a laser diode driver device, or a Light-Emitting Diode (LED) driver device. Among all the foregoing embodiments, the determining voltage of the frequency-regulating voltage output device (VCO) can be optionally and alternatively integrated or provided in the electronic device.

According to other embodiments of the present invention, a microcontroller unit (MCU) can be further employed to combine with a user electronic command, so as to provide control over the determining voltage. And for example, the user electronic command can be selected from a group of an unmanned aerial vehicle (UAV) computer, an unmanned ground vehicle (UGV) computer, a personal computer, a tablet computer, and a smart mobile device.

Therefore, on account of the technical contents disclosed in the present invention as mentioned above, it is apparent that the present invention is aimed to modulate a resonant frequency and a duty ratio of an electrical oscillator by controlling its input voltage. The input voltage to be applied can be controlled as being no greater than 5V with an approximate resolution of around 10 μV. The present invention is effective in implementing the electrical oscillator which generates an RF band signal and the resonant frequency of the RF band signal is tunable, and the duty ratio (pulse width) of the RF band signal is varied. By using such technical solutions provided in the present invention, an output modulation signal with a tunable frequency in RF band and varied duty ratio in 10%-50% is guaranteed.

Moreover, according to the proposed voltage-controlled varied frequency pulse width modulator in the present invention, it is also applicable to be miniaturized and integrated into a semiconductor IC circuit. For complying with a variety of application requirements, sundry voltages can be further utilized and applied in order to control the resonant frequency and duty ratio of the circuit's output signal.

In the following paragraphs, the Applicants go into an even deeper description so as to apply the technical contents disclosed in the present invention into a WPT (wireless power transfer) device. Please refer to FIG. 7 at the same time for a schematic diagram of the WPT device, which comprises a minimum power input control circuit 181, a zero transfer matrix 183, a voltage-controlled VFPWM 100, a gate driving circuit 171, a switching component 173, and an amplifier circuit 175. The gate driving circuit 171 is electrically connected with the voltage-controlled VFPWM 100. The switching component 173 is electrically connected between the gate driving circuit 171 and amplifier circuit 175.

The voltage-controlled VFPWM 100 provided thereof is the modulator circuit that can generate its output signal with a tunable resonant frequency and varied pulse width as the Applicants have proposed earlier in the present invention, such that the voltage-controlled VFPWM 100 is mainly composed of a frequency-regulating voltage output device (VCO) and a duty-ratio-regulating voltage output device. While being applied to a WPT device, it can be further combined with trend feedback waveforms of the gate driving circuit 171 together with the employed switching component 173 and the amplifier circuit 175 so as to meet a wireless power transmission application in response to the resonant frequency $f_0$=6.78 MHz.

In a preferred embodiment of the present invention, the above-mentioned switching component 173, for instance, can be a depletion-mode (D-mode) GaN high electron mobility transistor (GaN HEMT). In addition, according to one embodiment, the amplifier circuit 175 of the present invention is described as a class E amplifier circuit for an illustrative example. Please refer to Table 2 below for effective parameters of the class E amplifier circuit to be used in the embodiment of the present invention.

TABLE 2

|  | unit | value |
| --- | --- | --- |
| RL | kΩ | 5 |
| $C_{DS}$ | pF | 75 |
| C3 | pF | 75 |
| L1 | μH | 47 |
| L2 | μH | 8 |

Figure 7:
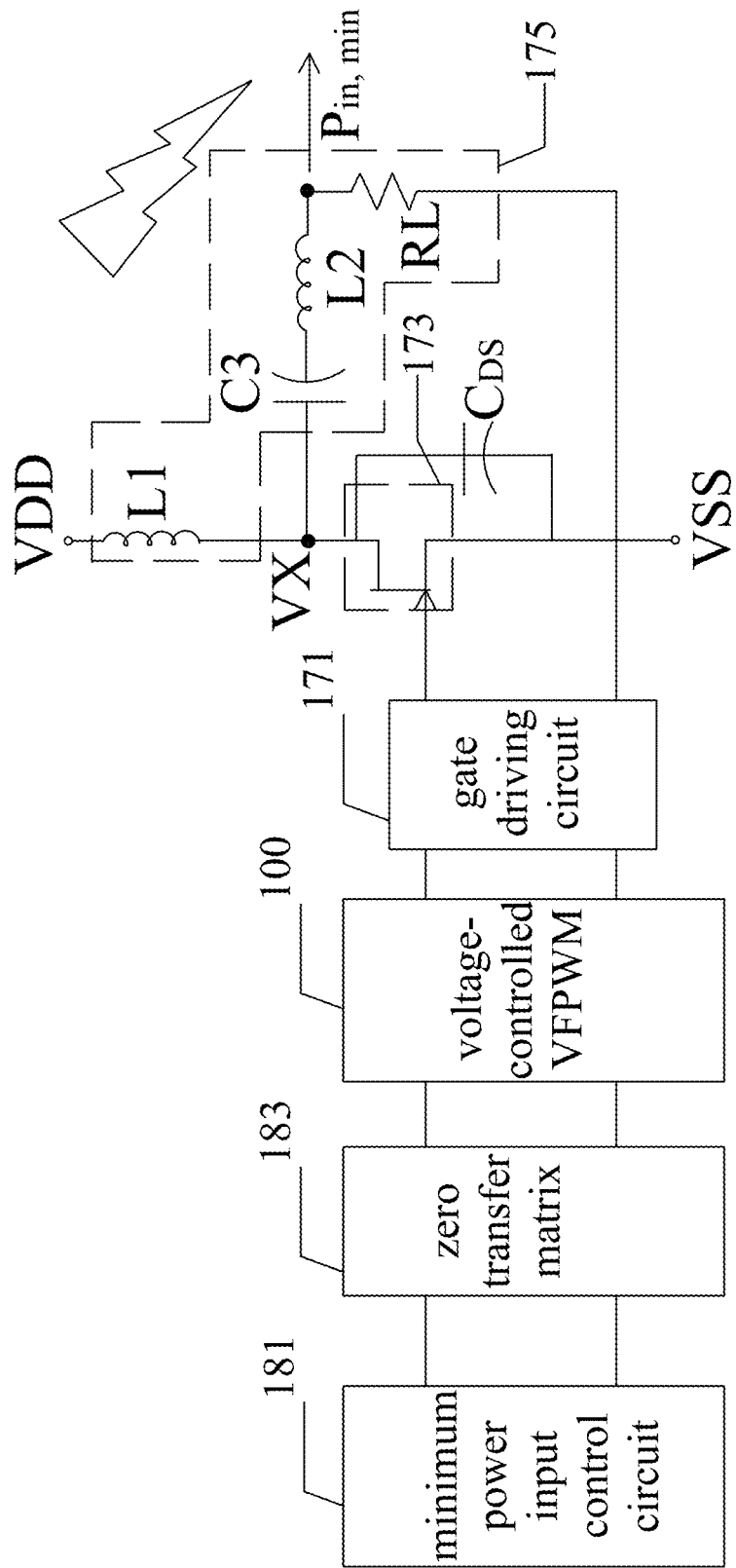
FIG. 7 shows a schematic diagram when the voltage-controlled varied frequency pulse width modulator (VFPWM) is further applied to a wireless power transfer device in accordance with the embodiment of the present invention.

According to the embodiment of the present invention as shown in FIG. 7, the class E amplifier circuit includes a capacitor C3, a first inductor L1, a second inductor L2 and a load resistor RL. The node VX is configured between the switching component 173, the first inductor L1 and the capacitor C3. Another end of the first inductor L1 which is opposite to the node VX is connected with the input voltage signal VDD and receiving the input voltage signal VDD. Another end of the capacitor C3 which is opposite to the node VX is connected with the second inductor L2, and the second inductor L2 is further connected to the load resistor RL, such that the correspondingly generated power is provided at an output terminal which is located between the second inductor L2 and the load resistor RL. As the technical contents previously disclosed in the present invention, the voltage-controlled VFPWM 100 is sophisticatedly designed to generate a modulation signal with tunable frequency and varied pulse width, such that the modulation signal has a specific determined resonant frequency $f_0$ and duty ratio δ. And owing to the novel and inventive characteristics, the amplifier circuit 175 is then being able to accordingly generate a corresponding power, that is the minimum power input $P_{in,min}$, at its output terminal through turning on and off the switching component 173 (preferably, a GaN HEMT), and a power minimization control strategy applied in the WPT device is achieved, which is also a further optimal and superior effect of the present invention.

That is to say, according to the practical application aspect of the present invention, a control voltage signal with a specific determined resonant frequency $f_0$ and duty ratio δ can be provided to a power transmitting side of a WPT system by employing the present invention. And subsequently, in view of its internal circuits, including the gate driving circuit, switching component (GaN HEMT), amplifier circuit (class E amplifier circuit) and etc., the class E amplifier circuit is able to be in response to generating a minimum power input, which will be sufficient for at least one power receiving units to receive and utilize. Through such a configuration, the generated minimum power input is believed to be optimized by the present invention.

Therefore, from a variety of above-disclosed embodiments of the present invention, it is apparent that the present invention proposes an extremely novel voltage-controlled varied frequency pulse width modulator (VFPWM) that can generate its output signal in RF band with tunable resonant frequency and varied pulse width. The proposed voltage-controlled VFPWM circuit mainly adopts a voltage-controlled oscillator (VCO) and an operational amplifier (op-amp) to achieve its circuit implementation. In addition, the proposed voltage-controlled VFPWM circuit can be further integrated in view of gate driving trend feedback waveforms of the switching component so as to have a feedback design of parameters of the gate driving circuit and to accomplish the implementation of D-mode GaN HEMT in WPT (wireless power transfer) devices. As such, an optimal power transmission efficiency of a wireless power transmission system can be obtained. Moreover, the operating requirements in 6.78 MHz resonant wireless power transmission applications can also be easily conformed by using a relatively simple look-up method. And thus, based on the design of the depletion-mode GaN HEMT parameters, it further helps to provide an optimized influence on the system reliability and application realization of the resonant wireless power transmission (WPT) system as well.

It is worth reminding that the present invention is certainly not limited to the plurality of internal circuit layouts as disclosed above in the earlier paragraphs. In other words, those skilled in the art are able to make modifications and variations according to the actual circuit specifications, with equality based on the contents and spirits of the invention, and yet, still fall into the scope of the invention.

In view of the above, it is believed that, compared with the prior arts, the embodiments of the present invention and the modulator circuit diagram being proposed are able to effectively solve the issues and deficiencies existing in the prior arts. Also, due to the electrical characteristics of the gate driving circuit and compatible parameters of the amplifier circuit, the present invention achieves not only to generate rapid and instant response and optimize the efficiency of a class E amplifier circuit but also to be able being widely applied in a variety of wireless charging or power converter devices in the semiconductor industry, integrated circuit industry, or power electronics industry and so on. As a result, the Applicants assert that the present invention is instinctive, effective, and highly competitive for incoming technologies, industries and researches developed in the future. Meanwhile, the Applicants also provide a variety of experimental data, empirical data, and so on to verify that the technical features, means, and effects achieved by the present invention are significantly different from the current solutions and can not be accomplished easily by those who are familiar with the industry. As a result, it is believed that the present invention is indeed characterized by patentability and shall be patentable soon in the near future.

It will be apparent to those skilled in the art that various modifications and variations can be made to the present invention without departing from the scope or spirit of the invention. In view of the foregoing, it is intended that the present invention cover modifications and variations of this invention provided they fall within the scope of the invention and its equivalent.

What is claimed is:

1. A voltage-controlled varied frequency pulse width modulator, comprising:
   a frequency-regulating voltage output device, which receives a determining voltage, decides a resonant frequency according to the determining voltage and outputs an oscillation signal having the resonant frequency; and
   a duty-ratio-regulating voltage output device, which includes a first input terminal and a second input terminal for respectively receiving a reference signal and the oscillation signal from the frequency-regulating voltage output device, such that the duty-ratio-regulating voltage output device determines a duty ratio through an inverting closed loop, adjusts the oscillation signal to have the duty ratio, and generates a modulation signal having the resonant frequency determined by the frequency-regulating voltage output device and the duty ratio at an output terminal of the duty-ratio-regulating voltage output device.

2. The voltage-controlled varied frequency pulse width modulator of claim 1, wherein the frequency-regulating voltage output device is a voltage-controlled oscillator, and the voltage-controlled oscillator outputs the oscillation signal based on: $f_0 = G_{Z0}(V_F - g(V_R))$, wherein $f_0$ is the resonant frequency of the oscillation signal, $G_{Z0}$ is a gain constant of the voltage-controlled oscillator, $g(V_R)$ is a nonlinear feedback function of the voltage-controlled oscillator, and $V_F$ is the determining voltage.

3. The voltage-controlled varied frequency pulse width modulator of claim 1, wherein a frequency band of the resonant frequency is a radio frequency (RF) band in a range of hundreds of kHz to 30 MHz.

4. The voltage-controlled varied frequency pulse width modulator of claim 1, wherein the inverting closed loop of the duty-ratio-regulating voltage output device comprises:
   an operational amplifier, being electrically connected between a high voltage level and a ground level and including a first input end, a second input end, and an output end, wherein the output end is electrically connected to the output terminal of the duty-ratio-regulating voltage output device;
   a first resistor, being electrically connected between the first input terminal of the duty-ratio-regulating voltage output device and the first input end of the operational amplifier, wherein a first capacitor is further connected between the first input end of the operational amplifier and the ground level;
   a second resistor, being electrically connected between the second input terminal of the duty-ratio-regulating voltage output device and the second input end of the operational amplifier, wherein a second capacitor is further connected between the second input end of the operational amplifier and the ground level;
   a third resistor, being electrically connected between the first input end and the output end of the operational amplifier; and
   a fourth resistor, being electrically connected between the second input end of the operational amplifier and the ground level, wherein the first resistor, the second resistor, the third resistor, and the fourth resistor are matched to have a same resistance.

5. The voltage-controlled varied frequency pulse width modulator of claim 4, wherein the operational amplifier determines the duty ratio based on:

$$\delta = \frac{1}{2} + \frac{T_{cm}}{(1+\alpha)T} \ln\left(\frac{V_Z - 2V_{ref}}{V_Z - V_{ref}}\right),$$

wherein $\delta$ is the duty ratio, $V_Z$ is the oscillation signal output by the frequency-regulating voltage output device, $V_{ref}$ is the reference signal, $\alpha$ is a feedback gain of the operational amplifier, $T_{cm}$ is a time constant for charging the first capacitor and the second capacitor in common mode, and T is a switching period for wireless power transmission.

6. The voltage-controlled varied frequency pulse width modulator of claim 1, wherein the duty ratio is in a range between 0 and 50%.

7. The voltage-controlled varied frequency pulse width modulator of claim 1, wherein a voltage level of the reference signal is in a range between 0 and 2.5V.

8. The voltage-controlled varied frequency pulse width modulator of claim 1, wherein the modulation signal having the resonant frequency and the duty ratio is directly or indirectly connected to and used by an electronic device, and the electronic device comprises a single integrated circuit chip, an assembly electronic circuit, an electromagnetic wave antenna, a signal amplifying circuit, a digital signal processing circuit, a digital logic electronic circuit, a wireless power transfer device, and an optical driving circuit.

9. The voltage-controlled varied frequency pulse width modulator of claim 8, wherein the determining voltage is integrated or provided in the electronic device.

10. The voltage-controlled varied frequency pulse width modulator of claim 8, wherein the wireless power transfer device further comprises a gate driving circuit connected with the voltage-controlled varied frequency pulse width modulator, a switching component connected between the gate driving circuit and an amplifier circuit, so as to meet a wireless power transmission application in response to the resonant frequency of 6.78 MHz by employing trend feedback waveforms of the gate driving circuit.

11. The voltage-controlled varied frequency pulse width modulator of claim 10, wherein the amplifier circuit is a class E amplifier circuit.

12. The voltage-controlled varied frequency pulse width modulator of claim 10, wherein the switching component is a GaN high electron mobility transistor (GaN HEMT).

13. The voltage-controlled varied frequency pulse width modulator of claim 1, wherein a microcontroller unit combined with a user electronic command is employed to provide control over the determining voltage, and the user electronic command is selected from a group of an unmanned aerial vehicle (UAV) computer, an unmanned ground vehicle (UGV) computer, a personal computer, a tablet computer, and a smart mobile device.

\* \* \* \* \*